United States Patent [19]
Burroughs et al.

[11] Patent Number: 5,404,496
[45] Date of Patent: Apr. 4, 1995

[54] COMPUTER-BASED SYSTEM AND METHOD FOR DEBUGGING A COMPUTER SYSTEM IMPLEMENTATION

[75] Inventors: Gregory D. Burroughs, Sunnyvale, Calif.; Eric R. DeLano, Ft. Collins, Colo.; Steven W. LaMar, Fremont, Calif.

[73] Assignee: Hewlett-Packard Company, Palo Alto, Calif.

[21] Appl. No.: 907,367

[22] Filed: Jul. 1, 1992

[51] Int. Cl.⁶ ............................................. G06F 11/00
[52] U.S. Cl. ................................. 395/575; 371/16.2; 395/500; 364/264.3; 364/DIG. 1
[58] Field of Search ............... 395/575, 650, 500; 364/264.3, 264.5, 232.3, 266.4, 265.6, 221.2, 268.1, 285.3; 371/16.2, 23

[56] References Cited

U.S. PATENT DOCUMENTS

| | | | |
|---|---|---|---|
| 4,967,386 | 10/1990 | Maeda et al. | 364/578 |
| 5,115,502 | 5/1992 | Tallman | 395/500 |
| 5,179,672 | 1/1993 | Genduso et al. | 395/575 |
| 5,245,638 | 9/1993 | Gustafson | 395/575 |
| 5,263,149 | 11/1993 | Winlow | 395/500 |

OTHER PUBLICATIONS

Nelson et. al., Linking Simulation Model Specification and Parallel Execution through Unity, 1991, pp. 223–231, Proceedings of Winter Simulation Conference; IEEE.

Gupta et. al.; Synthesis and Simulation of Digital System Containing Interacting Hardware and Software Components.; 1992; pp. 225–228; IEEE.

*Primary Examiner*—Robert W. Beausoliel, Jr.
*Assistant Examiner*—Norman M. Wright

[57] ABSTRACT

Synchronization of an architectural model of a computer architecture and a behavioral model of an implementation of the architecture for functional verification of the implementation. A communication channel is established between the two models through which simulation control and state information can be communicated and both models are available for simulating. Synchronization points in the models' executions are identified, and a synchronizer is implemented which instructs each model to simulate to a synchronization point and report relevant state information. The synchronizer can also verify state information from the two models in real time, flag errors, or instruct the architectural model to modify its state either to match known errors in the behavioral model or to match correct behavior to an asynchronous event.

19 Claims, 11 Drawing Sheets

BEHAVIORAL MODEL (STEP 408)

SYNCHRONOUS EVENT OF TWO INSTRUCTIONS

802 instruction address 80
instruction LOAD
data address 2000
data value 0
data loaded to register R3 instruction address 84
instruction FADD
source operand 1 is from FR4
source operand 2 is from FR5
result destination is written to FR6
source operand 1 value is 1.000
source operand 2 value is 2.000
relsult value is 4.000

ARCHITECTURAL MODEL (STEP 420)

Two instructions that do not match behavioral model state results due to a known error

804 instruction address 80
instruction LOAD
data address 2000
data value 1234
data loaded to register R3 instruction address 84
instruction FADD
source operand 1 is from FR4
source operand 2 is from FR5
result destination is written to FR6
source operand 1 value is 1.000
source operand 2 value is 2.000
relsult value is 3.000

RESULTS OF PROCESS

806

UNKNOWN ERROR IS LOGGED (STEP 430)

SYNCHRONIZER HALTS
SIMULATION (STEP 432)

FIG 8

COMPUTER-BASED SYSTEM AND METHOD FOR DEBUGGING A COMPUTER SYSTEM IMPLEMENTATION

BACKGROUND OF THE INVENTION

1. Technical Field

The invention relates generally to debugging a computer program. More specifically, this invention relates to the real-time verification that an implementation of a computer conforms to a given computer architecture.

2. Related Art

The design of a computer architecture implementation must conform to the given computer architecture it will support. This computer architecture defines high-level requirements and features such as the computer's instruction set and alternatives for virtual memory management and cache management. The particular implementation of the computer architecture includes features which are not specified by the computer architecture such as parallelism, pipelining, concurrency, execution order, and response to asynchronous events.

Typically, design verification techniques have modeled the computer architecture with a software simulator. This software simulator, defined as an architectural model, is capable of implementing the high-level requirements of the architecture referred to above. However, it does not model implementation specifics such as a processor pipeline or asynchronous behavior. The designing of an implementation of a computer architecture includes the development of a behavioral model of that implementation which models these details.

Design verification is the process of verifying that the behavioral model is architecturally correct, i.e., the behavioral model's implementation does indeed conform to the requirements of the computer architecture. This is accomplished by comparing the results of simulations using the behavioral model with simulations using the architectural model. In cases where the behavioral model results have different characteristics than the architectural model's, a translator is used to place the behavioral model's results in a form comparable to the architectural model's results so that a comparison may be performed.

Conventional methods of design verification have typically used both an architectural model and a behavioral model, extracting instruction traces from each simulation model, and, after simulation, verifying that the traces agree. When this method is utilized in a pipelined implementation, a depiper has been used to convert the pipelined execution trace of the behavioral model into the instruction trace of the architectural model.

This technique suffers from several difficulties. First, asynchronous events in the implementation modeled by the behavioral model (for example, interrupts) may cause differences in the two traces which are not errors.

Second, once an error has been identified, it may take a considerable amount of time to correct it. If the verification process is continued, these known errors in the behavioral model may mask errors occurring later in the simulation. In some implementations, the architectural model is temporarily modified to mimic the behavioral model's incorrect behavior in these cases so that the trace produced by the architectural model, though incorrect, will match the behavioral model implementation's trace up to the point of a later error. However, the architectural model does not have access to all the implementation details which reside in the behavioral model. It therefore cannot properly compensate for all classes of errors, since some errors depend on information which is not available to the architectural model. For example, if a known error is dependent on the state of the behavioral model implementation's pipeline, the architectural model would not be able to mimic the incorrect behavior and subsequent errors cannot be located until the first error is fixed in the behavior model. This increases the amount of experienced labor required to perform error identification.

Fourth, this technique places a great demand in computer storage space for the traces. Each trace from both models was typically taken and stored. Since each trace can be large in size, this limited the amount of traces that can be saved. This in turn limited the amount of verification that can take place during any single simulation.

Lastly, in the conventional techniques, a simulation could not be halted prior to completion to identify an error. If an error occurred early in the simulation, significant simulation time may be wasted as the simulation needlessly ran to completion.

What is needed is a computer implementation verification technique that will compensate for the occurrence of asynchronous events in the behavioral model in real-time and continue the simulation until an error is encountered. Since some problems may take days or weeks to correct, the verification technique must also be able to compensate for known errors in the behavioral model in a short period of time in order to prevent having to wait until each problem is corrected before testing can continue.

SUMMARY OF THE INVENTION

In the present invention, a computer-based system and method for verifying a computer system is implemented in real-time by synchronizing an architectural model and a behavioral model of the computer implementation. The architectural model is configured to model the requirements of the computer architecture and the behavioral model is configured to model the particular computer architecture implementation. Synchronization points in the models' executions are identified. A synchronizer is implemented which instructs each model to simulate to a synchronization point and report relevant state information. The synchronizer can also verify state information from the two models in real time, flag errors, or instruct the architectural model to modify its state either to match known errors in the behavioral model or to match correct behavior to an asynchronous event. A communication channel is established between the two models and the synchronizer through which simulation control and state information is communicated.

The behavioral model is compared to the architectural model when each has reported the state information needed to make the comparison. This step by step comparison is referred to as real-time verification; i.e. verification as the simulation is progressing rather than after the simulation is completed. This real-time verification significantly reduces storage and simulation time requirements. If a difference is due to an asynchronous event or a known error in the implementation, the architectural model may be instructed to change its state to match the implementation and continue the simulation in an attempt to uncover errors which would be otherwise masked.

BRIEF DESCRIPTION OF THE DRAWINGS

The foregoing and other features and advantages of the invention will be apparent from the following more particular description of preferred embodiments of the invention, as illustrated in the accompanying drawings, in which:

FIG. 4 comprises FIGS. 4(a)–4(c).

DETAILED DESCRIPTION OF THE PRESENT INVENTION

The preferred embodiment of the present invention will now be discussed with reference to the figures, where like reference numbers represent like elements.

1. Discussion

Figure 1:
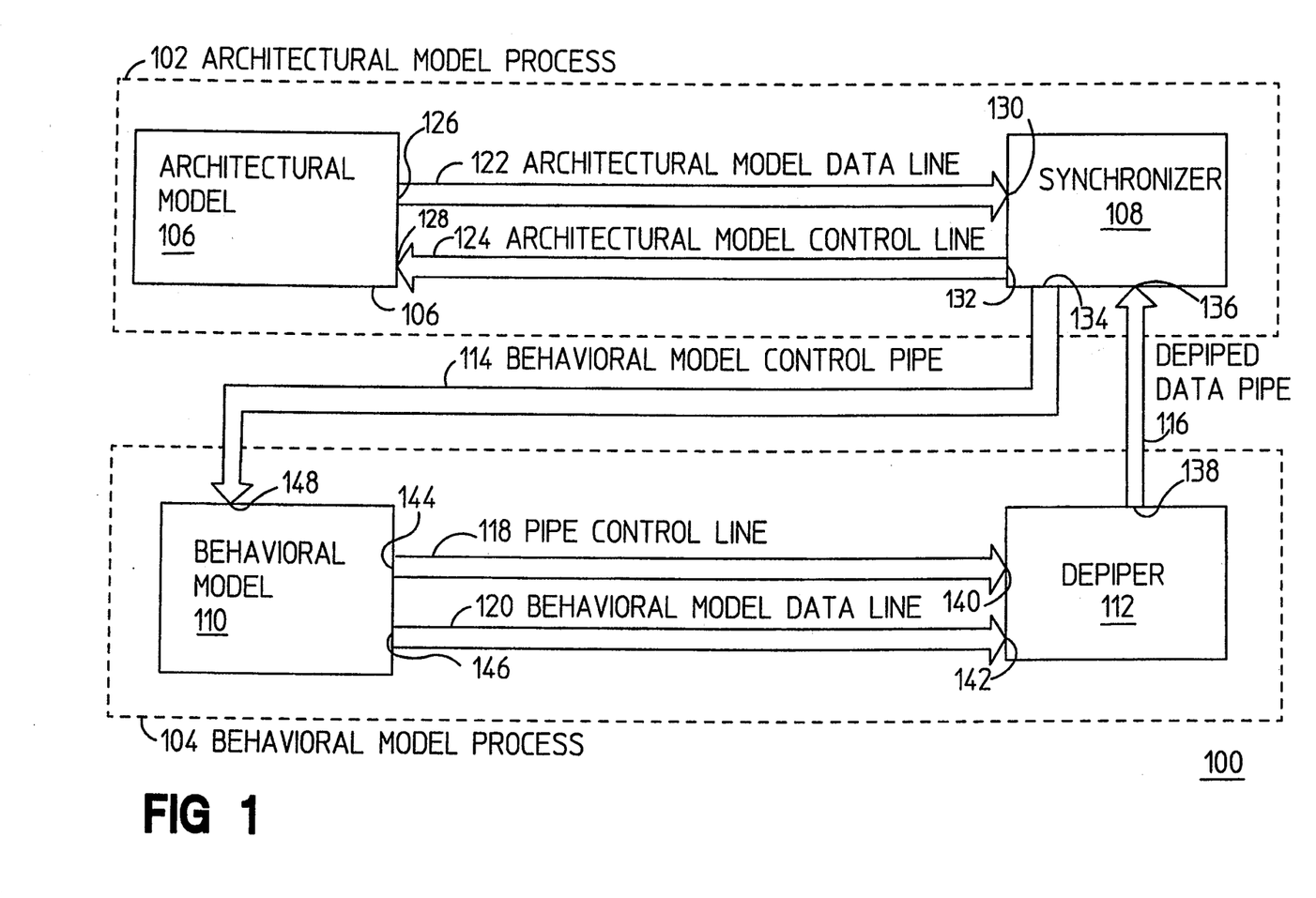
FIG. 1 is a high level system diagram illustrating the structure and interfaces of the preferred embodiment of the present invention.

FIG. 1 illustrates a preferred embodiment of the present invention. In the preferred embodiment of the present invention, system 100 is executed on a Hewlett Packard HP 700 series computer, in a UNIX environment, specifically HP-UX, both manufactured by Hewlett-Packard Company, Palo Alto, Calif., USA. However, one should know that the present invention can be implemented on any present or future developed computer platform utilizing any present or future developed operating system.

There are two processes in the preferred embodiment: an architectural model process 102 and a behavioral model process 104. A process is a set of instructions or routines which perform a functionally related task. Embedded within the architectural model process 102 is the architectural model 106 and the synchronizer 108. Embedded within the behavioral model process 104 is the behavioral model 110 and, as a diagnostic block, the depiper 112. Architectural models are well known in the art. For a detailed description of a suitable architectural model, see D. Magenheimer, *The HP Precision Simulator*, Hewlett-Packard Journal, Vol. 37, no. 8, August, 1986, pp. 40–43, incorporated herein by reference. Behavioral models are also well known in the art. For a detailed description of a suitable behavioral model, see Kohldhardt, Gaddis, et. al., *Design, Verification, and Test Methodology for a VLSI Chip Set*, Hewlett-Packard Journal, Vol. 38, no. 9, September 1987, pp. 18–26, incorporated herein by reference. In the present invention, the architectural model 106 and the behavioral model 110 execute concurrently.

In the preferred embodiment, the architectural model 106 models the instruction set of the computer architecture. In alternative embodiments, the architectural model may model other high-level requirements of a computer system, such as input/output requirements. Also, the architectural model may be a verified behavioral model which may or may not model the same architectural implementation as the behavioral model being verified. The architectural model may also be a hardware module which is known to meet the required specifications. The architectural model 102 has an output 126 for transmitting state information resulting from the simulations to synchronizer 108. Architectural model 102 also has input 128 for receiving commands from synchronizer 108.

The behavioral model 110 is an implementation of a computer architecture which is to be functionally verified to conform to the architectural model 106. The behavioral model 110 may take the form of, but not be limited to, a high-level descriptive software model of how a particular hardware module functions. Alternatively, it may take the form of a logic simulation of tile implementation or a switch implementation of the implementation's transistor network. Moreover, the behavioral model 110 may also be a hardware module which needs to be verified against the presently operational hardware module represented by architectural model 106. The behavioral model 110 has an input 148 for receiving control information instructing the behavioral model when and what to execute. The behavioral model 110 contains two outputs; output 144 to transmit specific information on how data is moving through the pipeline, and output 146 for transmitting behavioral model state information to the depiper 112 for translation.

In the preferred embodiment, the instruction traces of the behavioral model 110 are being compared to those of the architectural model 106. When this technique is utilized in a pipelined implementation, a depiper has been used to convert the pipelined execution trace of the behavioral model into the instruction trace of the architectural model. Translators such as depiper 112 are also well known in the art. The depiper 112 may be a subroutine, separate module, or separate computer, depending on the form of the architectural and behavioral models. For example, if the architectural model 102 processes instructions sequentially and the behavioral model 106 processes instructions in parallel, the depiper 112 may be a deparallizer which translates the behavioral model's parallel output to a sequential form for comparison with the architectural model's state information. In the alternative embodiment of the architectural model and behavioral model being hardware modules, the behavioral model, being developed at a later date to replace the architectural model, may perform the specified functions quicker and more efficiently. In such a case, depiper 112 may also be a hardware module, having to perform buffering and waiting functions in order to provide the synchronizer 104 with the data necessary to compare with the results of the older, slower architectural model. Depiper 112 contains output 138 for transmitting translated behavioral model state information. Depiper 112 also contains inputs 140 and 142 for receiving control information and behavioral state information, respectively.

Interprocess communication channels 114 and 116, defined as pipes in UNIX, are used to communicate between the architectural model process 102 and the behavioral model process 104. The behavioral model control pipe 114 conveys commands from synchronizer 108 located in architectural model process 102 to behavioral model 110 located in the behavioral model process 104. The other interprocess communication pipe is the depiped data pipe 116 which conveys depiped behavioral model data from depiper 112 located in the behavioral model process 104 to the synchronizer 108 located in the architectural model process 102.

Within the behavioral model process 104, depiper 112 receives the behavioral model state information from the behavioral model 110 via behavioral model data line 120. The depiper 112 then converts the behavioral model's state information into a depiped state and transfers the data to synchronizer 108 via depiped data pipe 116. The depiper 112 receives pipe control signals from the behavioral model 110 via pipe control line 118. Pipe control signals represent the necessary information for the depiper 112 to know when to take the instruction traces from the behavioral model.

The verification process is controlled in real-time by synchronizer 108 which controls architectural model 106 and behavioral model 110 by transmitting commands and state change information via architectural model control line 124 and behavioral model control line 114, respectively. The synchronizer 108 receives requested data and state information from the architectural model 106 and the behavioral model 110 via data lines 122 and 120, respectively. This real-time execution reduces the amount of total simulation time required to verify a particular implementation because the time between each error identification is reduced. In addition, real-time verification reduces the amount of memory required to store intermediate traces during the verification process.

In the preferred embodiment, the synchronizer 108 is a collection of subroutines within the architectural model 106. Synchronization points in the models' executions are identified and programmed as conditional checks in the synchronizer 108. They can also be programmed within the depiper 112, or within the behavioral model 110. A synchronization point is defined those points in the execution of the behavioral model simulation where a conditional check is satisfied. Once the synchronizer commands the models to execute until the occurrence of a synchronization point, the synchronizer 108 can also verify state information from the two models in real time and log or flags the errors. The synchronizer also instructs the architectural model 106 to modify its state either to match known errors in the behavioral model or to match correct behavior to an asynchronous event. Compensating for the occurrence of asynchronous events enables the simulations to continue to run until the occurrence of an unknown error rather than generating an error due to a mismatch between the behavioral model and architectural model results from the asynchronous event. The ability to compensate for the occurrence of known errors enables the verification process to continue despite the existences of errors which cannot be corrected immediately. Synchronizer 108 contains inputs 130 and 136 to receive architectural and behavioral model state information, and outputs 132 and 134 for outputting instructions to the architectural and behavioral models, respectively. The verification process is described in detail below with reference to FIGS. 4 through 8.

Figure 2:
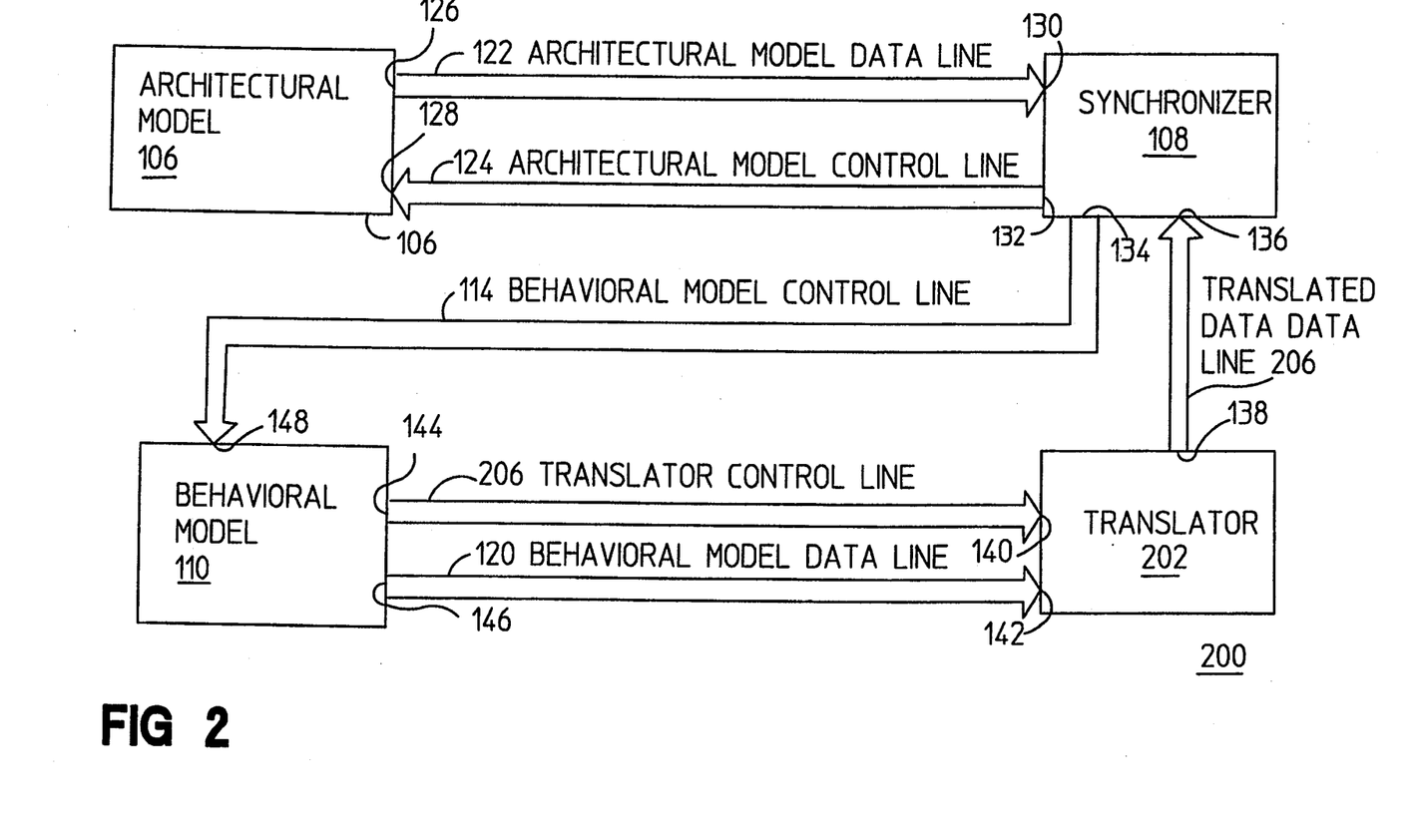
FIG. 2 is a high level system diagram illustrating the structure and interfaces of the simulation subsystems using a generic translator rather than a depiper.

Referring to FIG. 2, system 200 illustrates the preferred embodiment of the present invention with a generic translator 202 substituted for depiper 112. System 200 will be used for those applications that do not have a pipelined implementation. Translator 202 performs the typically needed function of transforming behavioral model 110 events to a form comparable to that of the architectural model 106. The translator 202 receives behavioral model state information and data that is output by the behavioral model 110 on behavioral model data line 120. The translator 202 receives information relating to the state the behavioral model 110 is presently in from behavioral model 110 via translator control line 206. Translator 202 transmits the translated data to the synchronizer 108 via translated data line 206.

Figure 3:
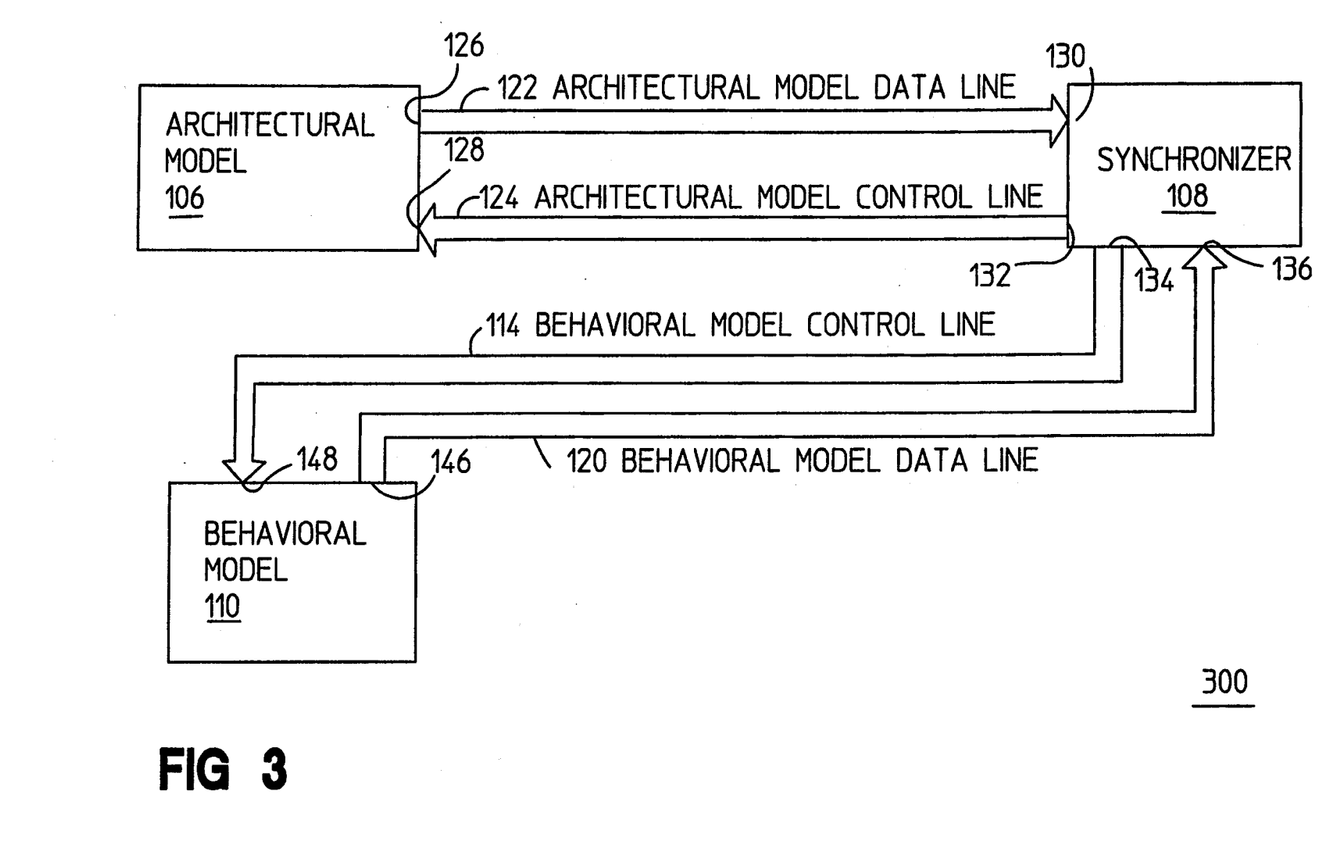
FIG. 3 is a high level system diagram illustrating the structure and interface of the present invention without a translator.

Referring to FIG. 3, system 300 is an illustration of a verification system which is comprised of an architectural model and behavioral model which produce state information of comparable form and structure. Under such conditions, a translator is not necessary. The synchronizer 108 will receive state information from each model over its respective model data line.

Figure 4:
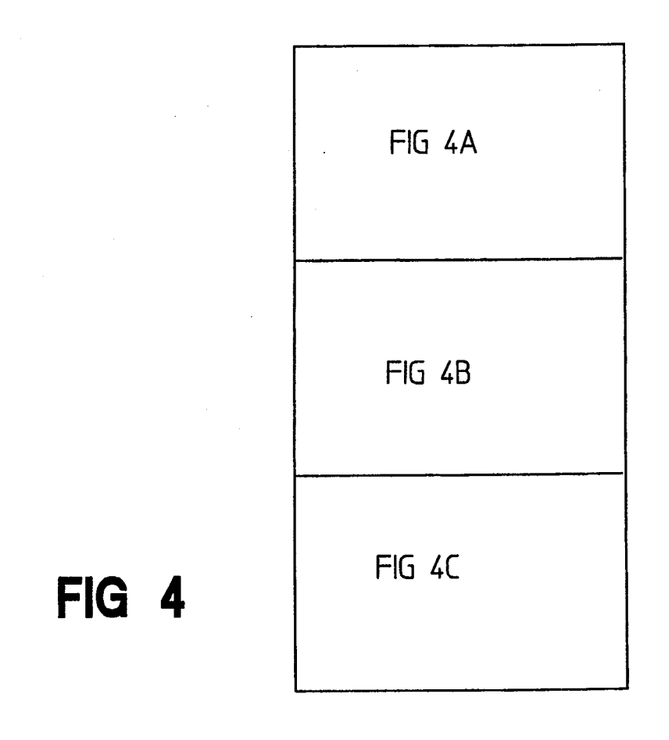
Figure 4A:
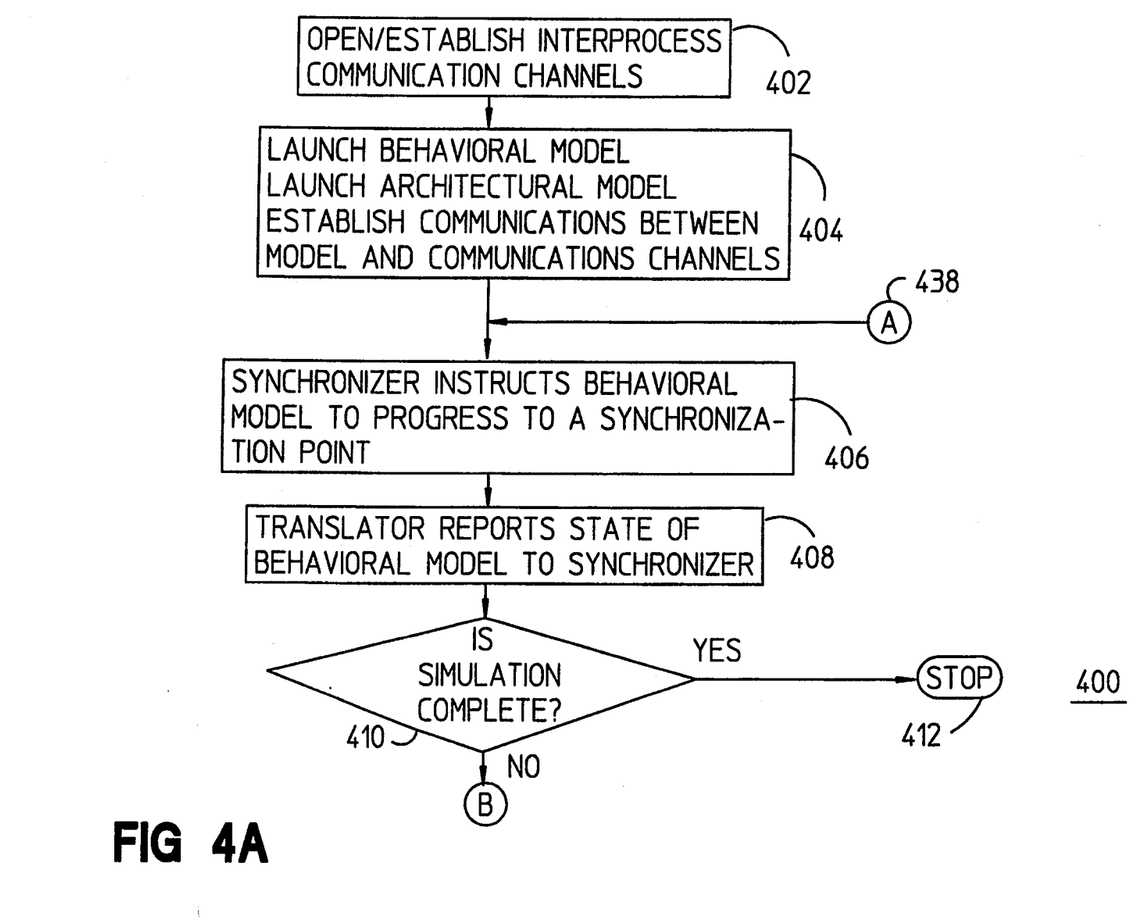
FIGS. 4(a)–4(c) are a flowchart of the simulation process for the preferred embodient shown in FIG. 1.
Figure 4B:
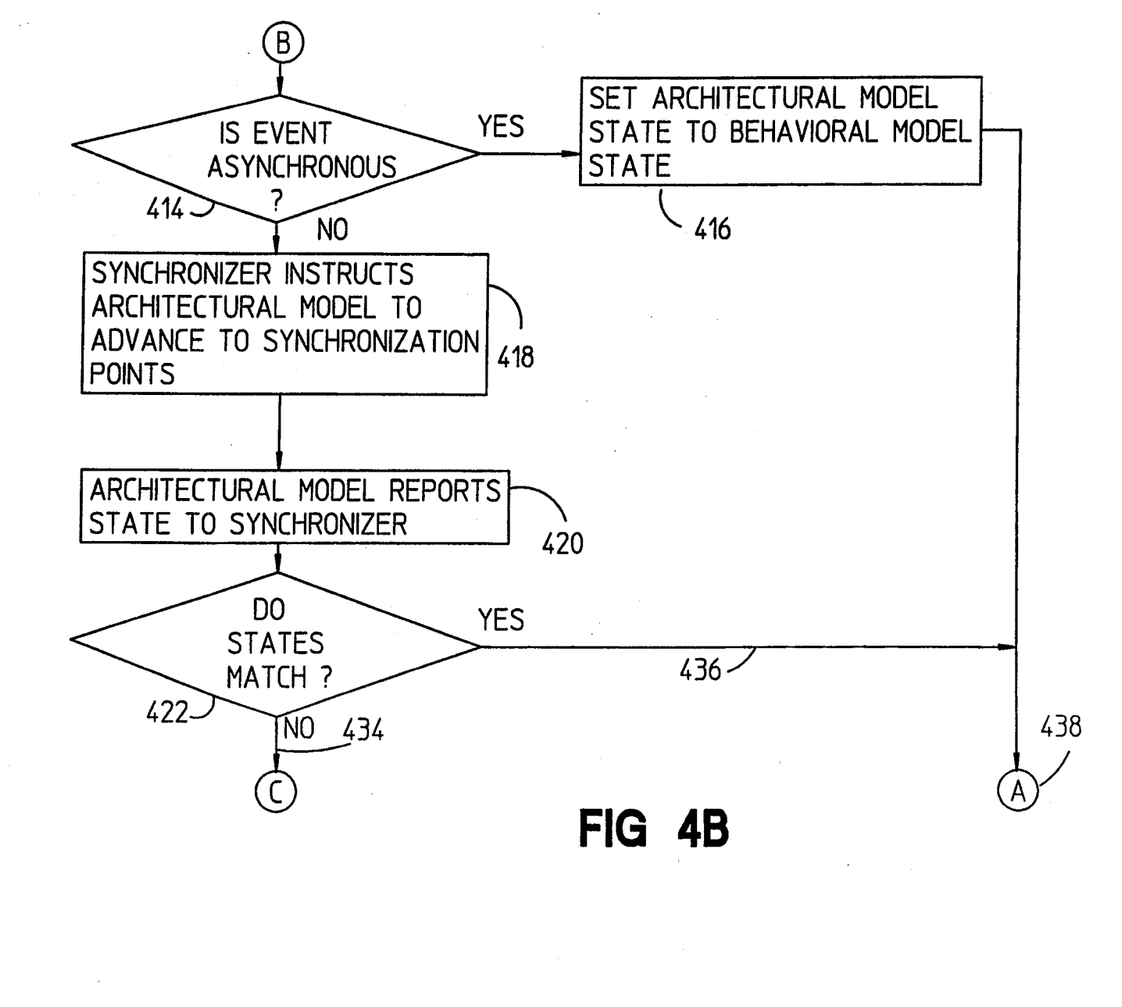
Figure 4C:
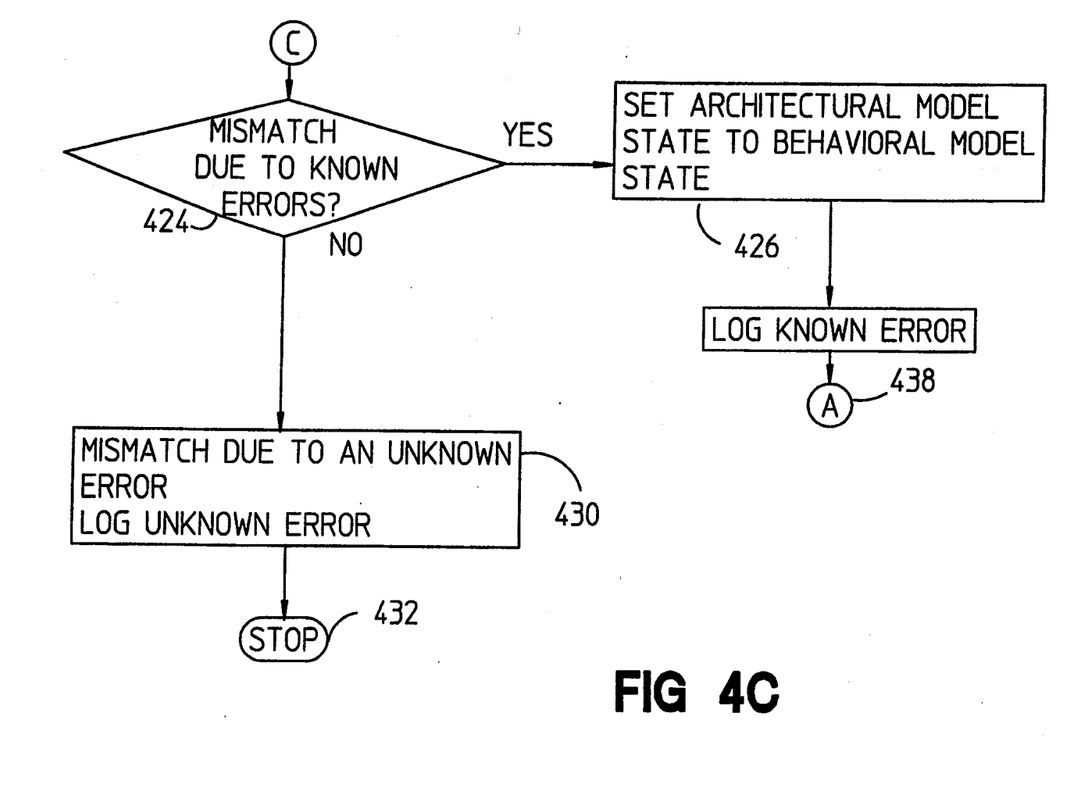

FIGS. 4(a)–4(c) illustrate a flow chart of the simulation process in the preferred embodiment of the present invention depicted in FIG. 3. The simulation process begins at step 402, where the interprocess communication channels are created. In the preferred embodiment, the creation of the interprocess communication channels is the execution of separate commands which establish the named pipes. Next, in step 404, the behavioral model process 104 and architectural model process 102 are launched and attached to the communication channels. The processes are attached to the interprocess communication channels by opening file pointers for reading from and writing to the pipeline. This is a requirement of the UNIX environment in which the preferred embodiment is executed. Similar requirements may exist in other operating system environments or data bus communications protocol.

In step 406, synchronizer 108 sends instructions across the behavioral model control pipe 114 to behavioral model 110 to perform processing up to a synchronization point. In step 408, the depiper 112 reports depiped state information from the behavioral model 110 to the synchronizer 108 via the depiped data pipe 116. At decision step 410, the synchronizer 108 checks if the behavioral model 110 has completed its simulation. If the simulation is complete, the synchronizer 108 halts the simulation at step 412 an no errors are logged. If the simulation is not complete, the simulation process continues to decision step 414.

At decision step 414, synchronizer 108 checks the data received from depiper 112 to determine of it is asynchronous data. If the information received from the depiper 112 represents asynchronous data, synchronizer 108 then instructs the architectural model 106 to change its state to reflect the asynchronous events as shown in step 416. System 100 will respond to any asynchronous event, such as interrupts, I/O activity, etc. The simulation process is then repeated at step 406, by path 438. The changing of the architectural model state to match the implementation of the behavioral model when an asynchronous event occurs, enables the simulation to continue and uncover errors which would otherwise be masked. If the data are not asynchronous, then, in step 418, the synchronizer 108 instructs the architectural model 106 to simulate up to the same synchronization point.

The architectural model 106 executes the instructions as specified and reports its state to the synchronizer 108 on architectural model data line 122. At decision step 422, the architectural model state information and the behavioral model state information are compared by the synchronizer 108. If the two sets of data match, no error has occurred, and the simulation process is repeated, by path 436, at step 406. If the data do not match, there is an error, and the mismatch is analyzed, by path 434.

In step 414, the synchronizer 108 determines if the error is due to the occurrence of a known error in the behavioral model 110 and, if so instructs the architectural model 106 to change its state to match the state reported by the behavioral model 110 as shown in step 426. This enables the synchronizer 108 to continue with the simulation until an unknown error occurs. The known error is logged in step 428, and the process is repeated at step 406 by path 438. If step 424 indicates that the mismatch is due to a unknown error, then the error has to be analyzed. The synchronizer 108 then logs the unknown error in step 430 and the simulation is halted in step 432.

2. Representative Example

An examples of the above process is now given with reference to FIGS. 5 through 8. The example is presented merely for purposes of illustration of the system and method of the present invention. The invention is not limited in any way by the representative example.

In this example, each model will execute two instructions: a LOAD instruction and a FADD instruction. The example is divided into four cases: when the results of the models match, when an asynchronous event occurs, when the results of the models do not match due to a known, and when they do not match due to an unknown error. In each case, the processing is the same for steps 402 through 406, therefore the cases will be discussed starting at step 406.

Figure 5:
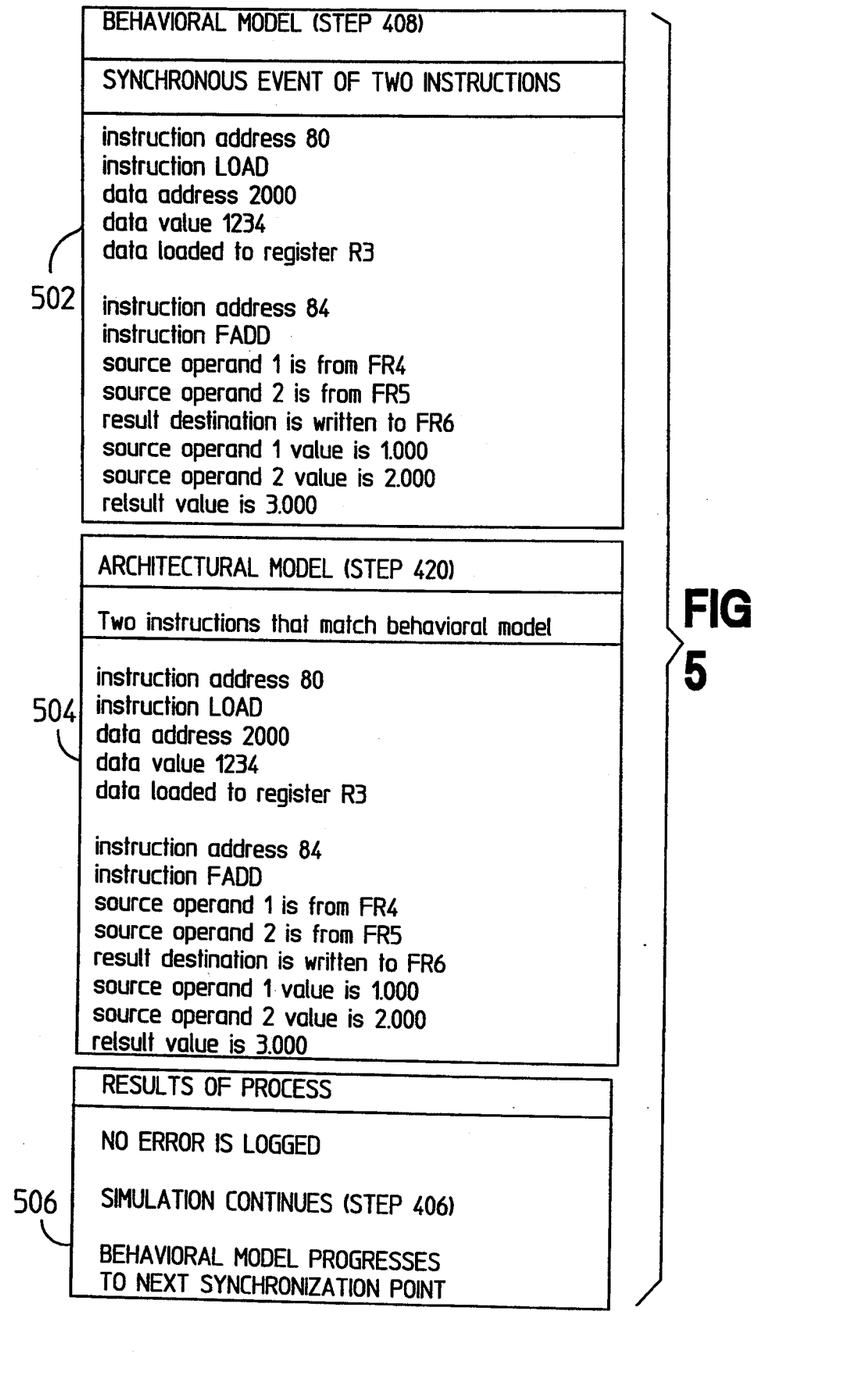
FIG. 5 illustrates the results generated in a matching simulations scenario.

FIG. 5 illustrates the results of an occurrence of a synchronous event which is a correct match between the behavioral model's execution and the architectural model's execution. At step 406, the behavioral model 110 receives instructions on behavioral simulation control pipe 111 from synchronizer 108 to simulate up to a synchronization point. In step 408 the behavioral model 110 reaches the first synchronization point after two instructions have been executed: a LOAD instruction and a FADD instruction. The depiper 112 reports behavioral model state information 502 to the synchronizer 108 over depiped data pipe 308. For the LOAD instruction, the depiper 112 reports the address of the instruction, the address from which data was fetched, the loaded value, and the register to which the load data was posted. For the FADD instruction, the depiper 112 reports the registers which sourced the operands and accepted the data, the operand values, and the computed result.

In step 414, the synchronizer 108 determines that the depiper 112 has not reported an asynchronous event, and in step 418 instructs the architectural model 106 to progress execute two instructions since the behavioral model executed two instructions. The synchronizer 108 sends the architectural model 106 commands on architectural model control line 124. The architectural model 106 also executes two instructions and, in step 420, reports architectural model state information 504 to the synchronizer 108 via architectural model data line 122. In step 422, the synchronizer 108 determines that the state information from the architectural model 106 matches the state information from the behavioral model 110. The results of the process 506 indicate that since the states are equivalent, no errors are logged, and execution continues from step 406 where the behavioral model 110 is instructed to progress to the next synchronization point.

Figure 6:
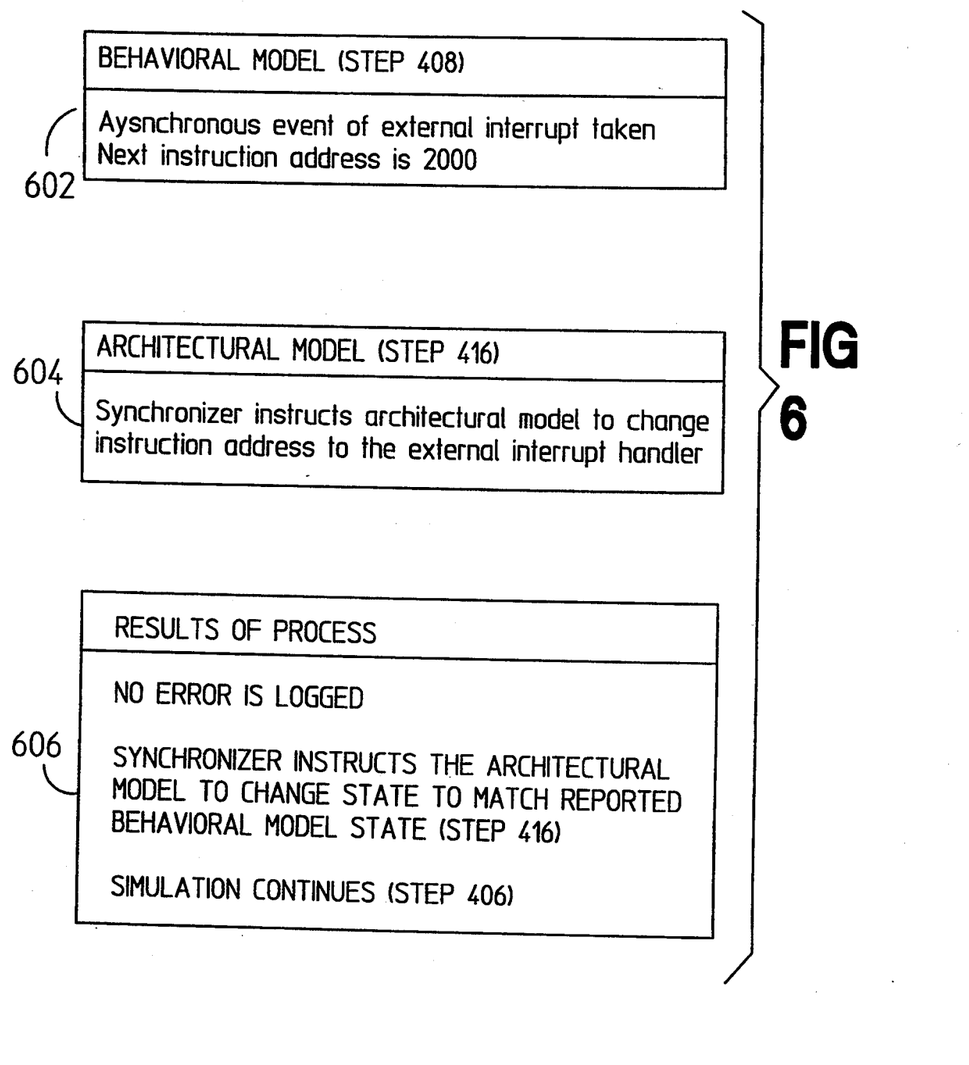
FIG. 6 illustrates the results generated by the occurrence of an asynchronous event.

FIG. 6 illustrates an asynchronous event reported by the depiper 112. At step 406, the behavioral model 110 is instructed to simulate up to a synchronization point. In step 408, the simulation reaches a synchronization point when an external interrupt is taken. At the synchronization point, depiper 112 reports behavioral model state information 602 to the synchronizer 108 via depiped data pipe 116. The behavioral model state information reported 602 consists of the fact that an external interrupt occurred and the instruction address from which program execution should continue. In step 414, the synchronizer 108 recognizes that the depiper 112 has reported an asynchronous event, and instructs the architectural model 102 to match the state reported by the depiper 112. The process results 606 are that no errors are logged and execution continues from step 406 where the state of the behavioral model 110 and the architectural model 106 are now equivalent.

Figure 7:
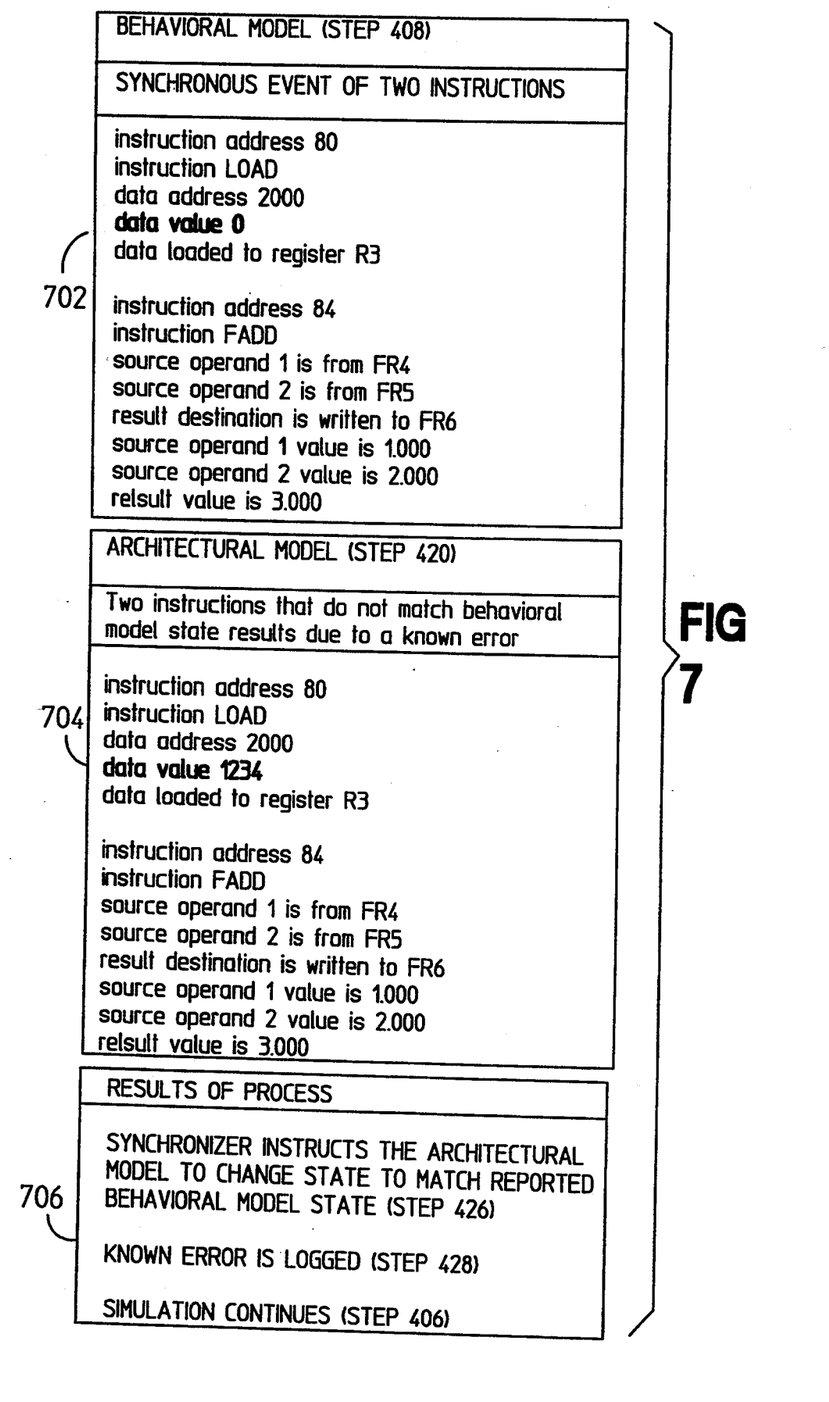
FIG. 7 illustrates the results generated by the occurrence of a known error in the behavioral model.

FIG. 7 illustrates the occurrence of known error in the behavioral model 110. For this example, suppose that the behavioral model 110 has an error which causes the LOAD instructions to sometimes incorrectly deliver a value of 0 instead of 1234, and suppose that the synchronizer 108 has been programmed to recognize this error condition.

At step 406, the behavioral model 110 is instructed to simulate up to a synchronization point. In step 408 the behavioral model 110 reaches the first synchronization point after the two instructions have been executed. The depiper 112 reports behavioral model state information 702 to the synchronizer 108 via depiped data pipe 308. For the LOAD instruction, the depiper 112 reports the same data as in the example of FIG. 5, except that a load value of 0 is reported rather than a value of 1234. For the FADD instruction, the depiper reports the same data as in the example of FIG. 5. In step 414, the synchronizer 108 determines that the depiper 112 has not reported an asynchronous event, and instructs the architectural model 102 to step to a synchronization point, step 418. In step 420, the architectural model 102 also executes two instructions and reports architectural model state information 704 to synchronizer 108 via data line 120. In step 422, the synchronizer 108 recognizes a mismatch between the architectural model state information 704 and the behavioral model state information 702, and also recognizes that the mismatch follows the pattern of a known error in the behavioral model 110. The synchronizer then instructs the architectural model 102 to set its register R3 to contain a value 0 to match the behavioral model state data 702. The process results 706 are that the known error is logged and execution continues uninterrupted front step 406 until the occurrence of an unknown error is encountered.

Figure 8:
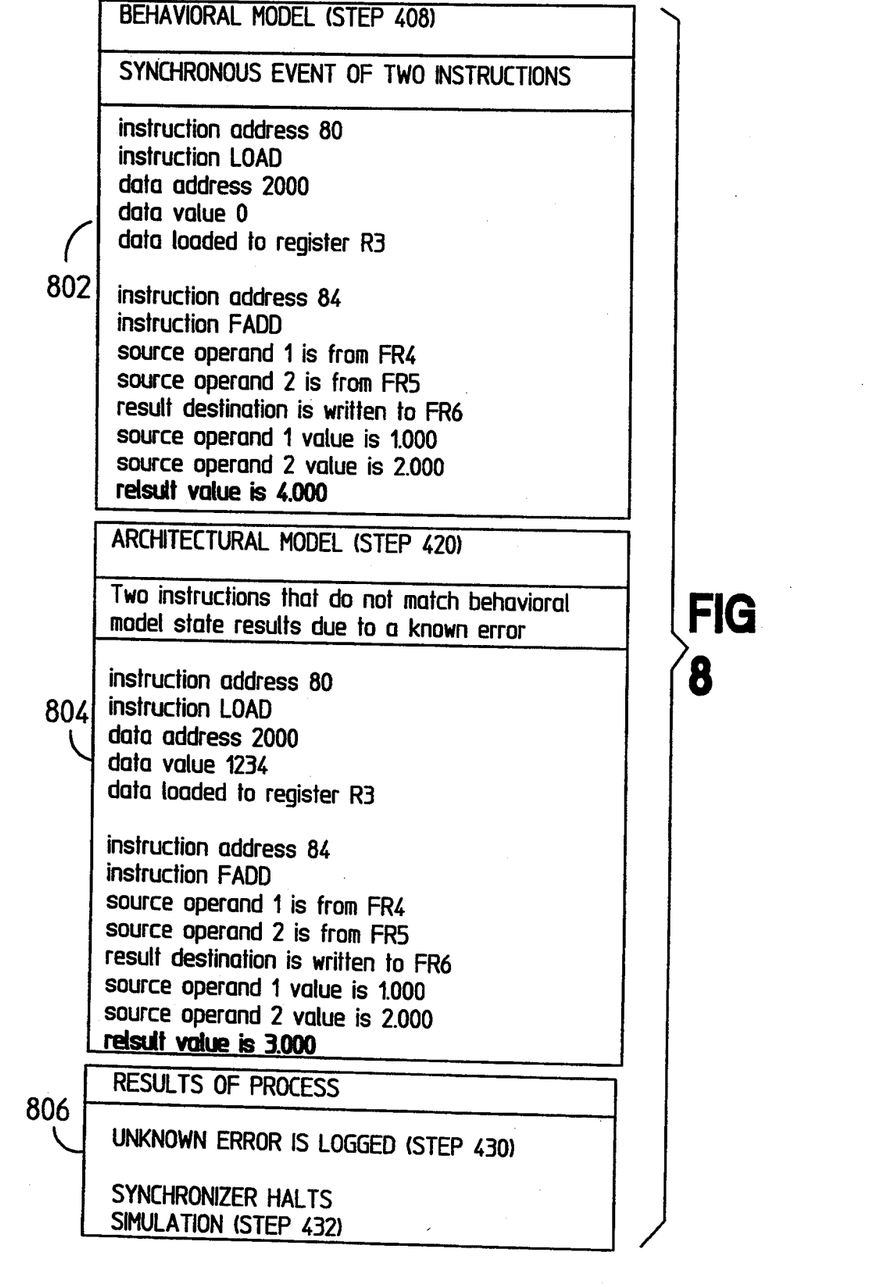
FIG. 8 illustrates the results generated by the occurrence of an unknown error in the behavioral model.

FIG. 8 illustrates the occurrence of a mismatch due to a new error in the behavioral model 110. For this example, suppose that the behavioral model 110 has an error which causes the FADD instructions to incorrectly calculate the value of 1.0+2.0 to be 4.0 instead of 3.0, and suppose that this error has not been detected before in the verification process.

At step 406, the behavioral model 110 is instructed by the synchronizer 108 via behavioral simulation control pipe 124 to simulate up to a synchronization point. In step 408, the behavioral model 110 reaches a synchronization point after the two instructions have executed. The depiper 112 reports the behavioral model state information 802 to the synchronizer 108 via depiped data pipe 308. For the LOAD instruction, the depiper 112 reports the same data as in the example of FIG. 5. For the FADD instruction, the depiper 112 reports the same data as in the example of FIG. 5, except that the computed result is 4.0. In step 414, the synchronizer 108 determines that the depiper 112 has not reported an asynchronous event, and proceeds to step 418 where the synchronizer 108 then instructs the architectural model 106 via architectural model control line 124 to step to execute two instructions. In step 420, the architectural model 106 also executes two instructions, and reports architectural model state information 804 to the synchronizer 108 via architectural model data line 122. In step 422, the synchronizer 108 recognizes a mismatch between the architectural model state information 804 and the behavioral model state information 802, but does not recognize the mismatch as a known error in the behavioral model 110. The results of the process 806 are that the error is logged in step 430, and simulation is halted in step 432.

What is claimed is:

1. A computer-based system for verifying an implementation of a computer architecture, comprising:
   an architectural model configured to model the requirements of the computer architecture;
   a behavioral model configured to model the implementation of the computer architecture, said behavioral model designed to conform with said computer architecture;
   a synchronizer configured to control the execution of said architectural model and said behavioral model such that said architectural model and said behavioral model execute concurrently, said synchronizer configured to generate architectural model state control commands for controlling the state of said architectural model and behavioral model state control commands for controlling the state of said behavioral model.

2. The computer-based system of claim 1, wherein said synchronizer is configured to compare results of said behavioral model execution with results of said architectural model execution, said comparison performed at predetermined points in said execution of said behavioral model and said architectural model.

3. The computer-based system of claim 1, wherein said architectural model comprises:
   an architectural model data output for outputting said results of said architectural model execution for comparison with said results of said behavioral model execution; and
   an architectural model control input for receiving said architectural model state control commands from said synchronizer, said architectural model state control commands determining which portion of said architectural model is executed.

4. The computer-based system of claim 3, wherein said behavioral model comprises:
   a behavioral model data output for outputting said results of said behavioral model execution for comparison with said results of said architectural model execution; and
   a behavioral model control input for receiving said behavioral model state control commands from said synchronizer, said behavioral model state control commands determining which portion of said behavioral model is executed.

5. The computer-based system of claim 4, wherein said synchronizer comprises:
   a behavioral model control output for outputting said behavioral model state control commands, said behavioral model control output coupled to said behavioral model control input of said behavioral model;
   a behavioral model data input for receiving said results of said behavioral model execution for comparison with said architectural model results, said behavioral model data input coupled to said behavioral model data output;
   an architectural model control output for controlling said architectural model, said architectural model control output coupled to said architectural model control input of said architectural model; and
   an architectural model data input for receiving said results of said architectural model execution for comparison to said results of said behavioral model execution, said architectural model data input coupled to said architectural model data output.

6. The computer-based system of claim 5, further comprising:
   translation means for translating said results and said state information of said behavioral model execution to a form comparable to said results and said state information of said architectural model execution, said translation means coupled to said behavioral model and said synchronizer.

7. The computer-based system of claim 6, wherein said translation means further comprises:
   a depiper configure to translate said behavioral model results to depiped dam, wherein said behavioral model results are comprised of behavioral model operations organized chronologically, and further wherein said depiped data comprised of said behavioral model operations organized by architectural model operation.

8. The computer-based system of claim 7, wherein said synchronizer comprises:
   comparison means for comparing in real-time said results of said architectural model execution with said results of said behavioral model execution; wherein said comparison is performed at an occurrence of a predetermined condition in said behavioral model.

9. The computer-based system of claim 8, wherein said synchronizer further comprises:
   known error compensation means for preventing the occurrence of known errors from masking the occurrence of said unknown errors, said known errors being previously identified by said synchronizer, said known error compensation means including,
     programming means for programming said synchronizer and/or said behavioral model to identify said known errors in said behavioral model,
     translation means for transitioning said architectural model to a state equivalent to the state of said behavioral model when said known error occurred, and
     continuation means for repeating said comparison means until an unknown error is identified.

10. The computer-based system of claim 9, wherein said synchronizer further comprises:

asynchronous event compensation means for preventing mismatches due to the occurrence of said asynchronous event to be identified as an error, said asynchronous event compensation means including,     identification means for identifying the occurrence of an asynchronous event in said behavioral model,     architectural model state transition means for transitioning said architectural model to the behavioral model state addressing said asynchronous event, and     continuation means for repeating said comparison means until the occurrence of a specified number of unknown error.

11. The computer-based system of claim 1, further comprising:

translation means for translating said results and said state information of said behavioral model execution to a form comparable to said results and said state information of said architectural model execution, said translation means coupled to said behavioral model and said synchronizer.

12. The computer-based system of claim 11, wherein said synchronizer comprises:

comparison means for comparing in real-time said results of said architectural model execution with said results of said behavioral model execution;

wherein said comparison is performed at an occurrence of a predetermined condition in said behavioral model.

13. The computer-based system of claim 12, wherein said synchronizer further comprises:

known error compensation means for preventing the occurrence of known errors from masking the occurrence of said unknown errors, said known errors being previously identified by said synchronizer, said known error compensation means including,         programming means for programming said synchronizer and/or said behavioral model to identify said known errors in said behavioral model,         translation means for transitioning said architectural model to a state equivalent to the state of said behavioral model when said known error occurred, and         continuation means for repeating said comparison means until an unknown error is identified.

14. The computer-based system of claim 13, wherein said synchronizer further comprises:

asynchronous event compensation means for preventing mismatches due to the occurrence of said asynchronous event to be identified as an error, said asynchronous event compensation means including,         identification means for identifying the occurrence of an asynchronous event in said behavioral model,         architectural model state transition means for transitioning said architectural model to the behavioral model state addressing said asynchronous event, and         continuation means for repeating said comparison means until the occurrence of a specified number of unknown error.

15. A computer-based method for verifying that an implementation of a computer architecture conforms to the requirements of a computer architecture, the implementation is modelled by a behavioral model and the computer architecture is modelled by an architectural model, the verification performed by a synchronizer, the computer-based method comprising the steps of:

(1) executing said behavioral model to a predetermined state, by transferring behavioral model state control commands from said synchronizer to said behavioral model, including the step of,     (a) instructing said behavioral model to execute until the occurrence of a predetermined state in said behavioral model;

(2) executing said architectural model until said architectural model achieves the same state as said behavioral model state, by transferring architectural model state control commands from said synchronizer to said architectural model, including the steps of:

(a) instructing the architectural model to change its state to the same state as the behavioral model when said behavioral model results indicate the occurrence of an asynchronous event in the behavioral model, and     (b) instructing the architectural model to execute until the occurrence of a predetermined condition in the behavioral model and providing said results of said architectural model execution to the synchronizer;

(3) comparing the results generated by said architectural model execution with the results generated by said behavioral model execution;

(4) controlling said execution of steps (1) and (2) based on the results of said comparing step (3); and (5) repeating said execution of said steps (1) through (4) until the behavioral model is completely verified.

16. The computer-based method of claim 15, wherein said step (1) further comprises the steps of:

(b) translating the results of said behavioral model execution to a form comparable to the results produced by the architectural model; and     (c) providing said translated behavioral model results to the synchronizer.

17. The computer-based method of claim 15, further comprising the step of:

(6) instructing the architectural model to change its state to the state of the behavioral model when said architectural model results are not the same as said behavioral model results due to the occurrence of a previously defined error, wherein the synchronizer and/or the behavioral model is programmed to recognize said known error.

18. The computer-based method of claim 15, further comprising the step of:

(6) continuing the verification process until the occurrence of an unknown error in the behavioral model when said results of said architectural model execution are the same as said results of said behavioral model execution.

19. The computer-based method of claim 15, further comprising the steps of:

(6) logging the mismatch between said architectural model results and said behavioral model results; and     (7) halting said verification process when said architectural model results are not the same as said behavioral model results due to the occurrence of an unknown error.

* * * * *